United States Patent
Chang et al.

(10) Patent No.: US 9,263,322 B2
(45) Date of Patent: Feb. 16, 2016

(54) RELIABLE CONTACTS

(71) Applicant: GLOBALFOUNDRIES Singapore Pte. Ltd., Singapore (SG)

(72) Inventors: Tian-Lin Chang, Singapore (SG); Jianfang Liang, Singapore (SG); Aaron Chen, Singapore (SG); Yew Tuck Clament Chow, Singapore (SG); Fan Zhang, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 72 days.

(21) Appl. No.: 14/029,820

(22) Filed: Sep. 18, 2013

(65) Prior Publication Data

US 2015/0076669 A1   Mar. 19, 2015

(51) Int. Cl.
*H01L 21/311* (2006.01)
*H01L 21/768* (2006.01)
*H01L 23/48* (2006.01)

(52) U.S. Cl.
CPC .... *H01L 21/76804* (2013.01); *H01L 21/31116* (2013.01); *H01L 21/31144* (2013.01); *H01L 23/481* (2013.01); *H01L 2924/0002* (2013.01)

(58) Field of Classification Search
CPC .............. H01L 2224/023; H01L 23/34; H01L 23/3675; H01L 23/3736; H01L 23/49827
USPC .................. 438/700, 701, 713; 257/368, 635, 257/E21.578
See application file for complete search history.

(56) References Cited

U.S. PATENT DOCUMENTS

| | | | |
|---|---|---|---|
| 2008/0284006 A1* | 11/2008 | Hong et al. ................... | 257/734 |
| 2009/0294986 A1* | 12/2009 | Yan et al. ...................... | 257/774 |
| 2010/0258873 A1* | 10/2010 | Harashima et al. ........... | 257/368 |

* cited by examiner

*Primary Examiner* — Andy Huynh
(74) *Attorney, Agent, or Firm* — Horizon IP Pte. Ltd.

(57) ABSTRACT

Semiconductor devices and methods for forming a semiconductor device are presented. The method includes providing a substrate having a device component with a contact region. A contact dielectric layer is formed on the substrate, covering the substrate and device component. The contact dielectric layer includes a lower contact dielectric layer, an intermediate contact dielectric etch stop layer formed on the lower contact dielectric layer, and an upper contact dielectric layer formed on the intermediate contact dielectric etch stop layer. A contact opening is formed through the contact dielectric layer. The contact opening has an upper contact sidewall profile in the upper contact dielectric layer and a lower tapered contact sidewall profile in the lower contact dielectric layer. The tapered sidewall profile prevents shorting with the device component.

21 Claims, 11 Drawing Sheets

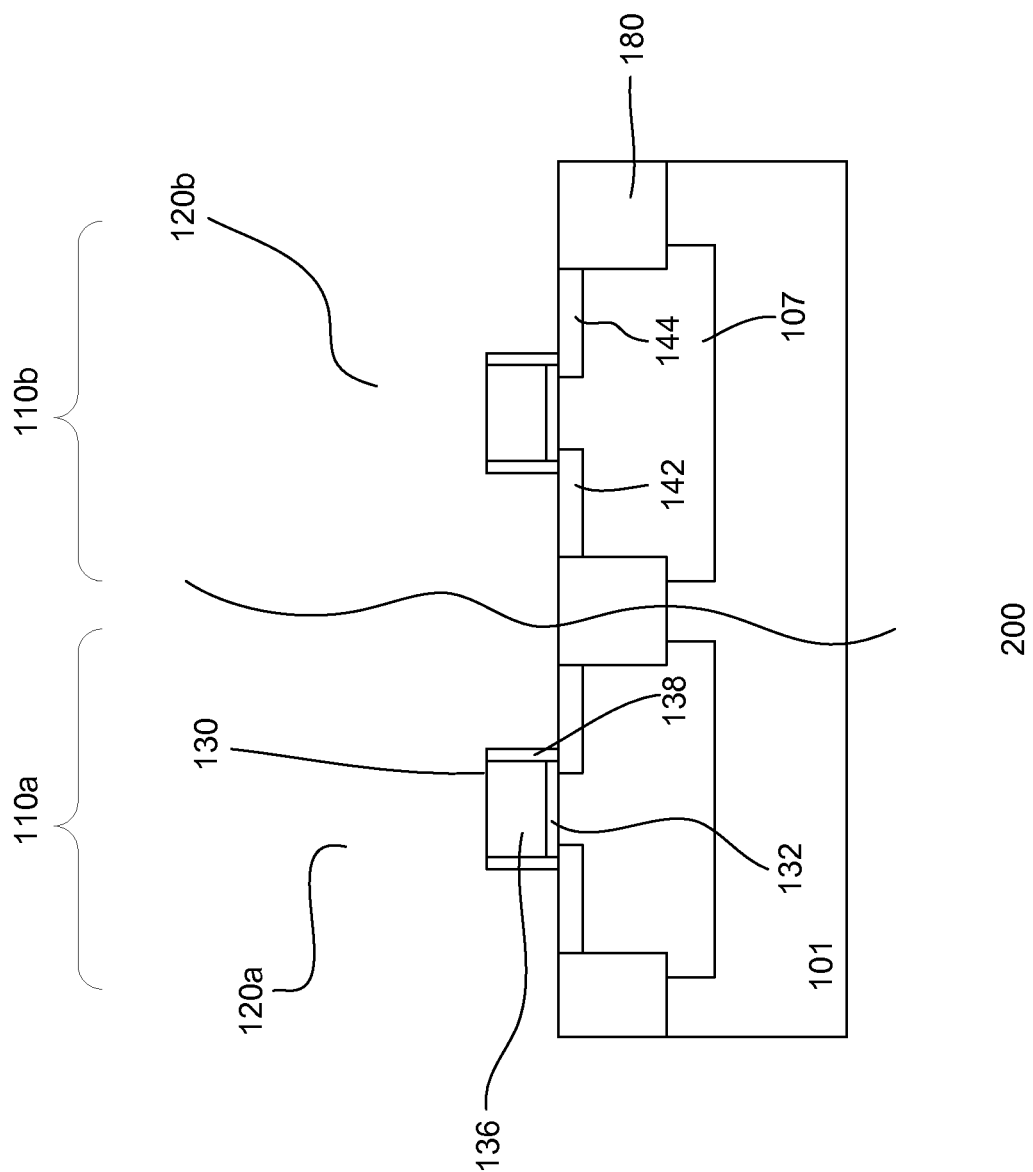

RELIABLE CONTACTS

BACKGROUND

The fabrication of integrated circuits (ICs) involves the formation of features on a substrate that make up circuit components, such as transistors, resistors and capacitors. The devices are interconnected, enabling the IC to perform the desired functions. Interconnections are formed by forming contacts and conductive lines in a dielectric layer using, for example, damascene techniques. A damascene structure, for example, includes a via or contact hole in a lower portion and a trench in an upper portion. The via serves as a contact to a device while the trench contains the conductive line for connecting the device to, for example, other devices.

It is important for contacts to be coupled properly with the contact regions, such as gate and source/drain (S/D) contact regions, of the transistors. However, processing errors may cause expanded contact profiles. As a result, the separation distance between the S/D contacts and the gate is reduced. This may lead to electrical shorts between the S/D contacts and the gate. Furthermore, processing errors may also form expanded conductive lines which may undesirably lead to electrical shorts between the conductive lines above and the gate below. In cases where there are more than one type of devices formed on the same substrate, contact profile uniformity is also difficult to control due to the different heights of these different devices. These phenomena adversely render the IC malfunction.

From the foregoing discussion, it is desirable to provide a device which is devoid of the above-mentioned problem, thus increasing the reliability of the IC. It is also desirable to provide a simplified process for forming a device with increased reliability.

SUMMARY

Embodiments generally relate to semiconductor devices or integrated circuits (ICs) and methods for forming the semiconductor devices. In one embodiment, a method for forming a device is disclosed. The method includes providing a substrate having a device component with a contact region. A contact dielectric layer is formed on the substrate, covering the substrate and device component. The contact dielectric layer includes a lower contact dielectric layer, an intermediate contact dielectric etch stop layer formed on the lower contact dielectric layer, and an upper contact dielectric layer formed on the contact dielectric etch stop layer. A contact opening is formed through the contact dielectric layer. The contact opening has an upper contact sidewall profile in the upper contact dielectric layer and a lower tapered contact sidewall profile in the lower contact dielectric layer. The tapered sidewall profile prevents shorting with the device component.

In another embodiment, a method for forming a device is presented. A substrate having at least one device component with a contact region is provided. A contact dielectric layer is formed on the substrate, covering the substrate and device component. A contact opening is formed through the contact dielectric layer. The contact opening has an upper contact sidewall profile in an upper portion of the contact dielectric layer portion and a lower contact sidewall profile different than the upper contact sidewall profile in a lower portion of the contact dielectric layer. The lower sidewall profile prevents shorting with the device component.

In yet another embodiment, a device is disclosed. The device includes a substrate having at least one device component with a contact region. A contact dielectric layer is disposed on the substrate. The contact dielectric layer covers the substrate and device component. The device includes a contact opening passing through the contact dielectric layer. The contact opening has an upper contact sidewall profile in an upper portion of the contact dielectric layer portion and a lower contact sidewall profile different than the upper contact sidewall profile in a lower portion of the contact dielectric layer. The lower sidewall profile prevents shorting with the device component.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-2i show cross-sectional views of an embodiment of a process for forming a device.

DETAILED DESCRIPTION

Embodiments generally relate to semiconductor devices or integrated circuits (ICs). More particularly, some embodiments relate to contacts for interconnecting circuit components, such as transistors in devices. The devices, for example, include complementary transistors, such as complementary metal oxide semiconductor (CMOS) transistors. The devices may include other types of circuit components. The devices or ICs can be incorporated into or used with, for example, consumer electronic products, and particularly portable consumer products such as, for example, mobile phones, tablets, and PDAs.

Figure 1A:
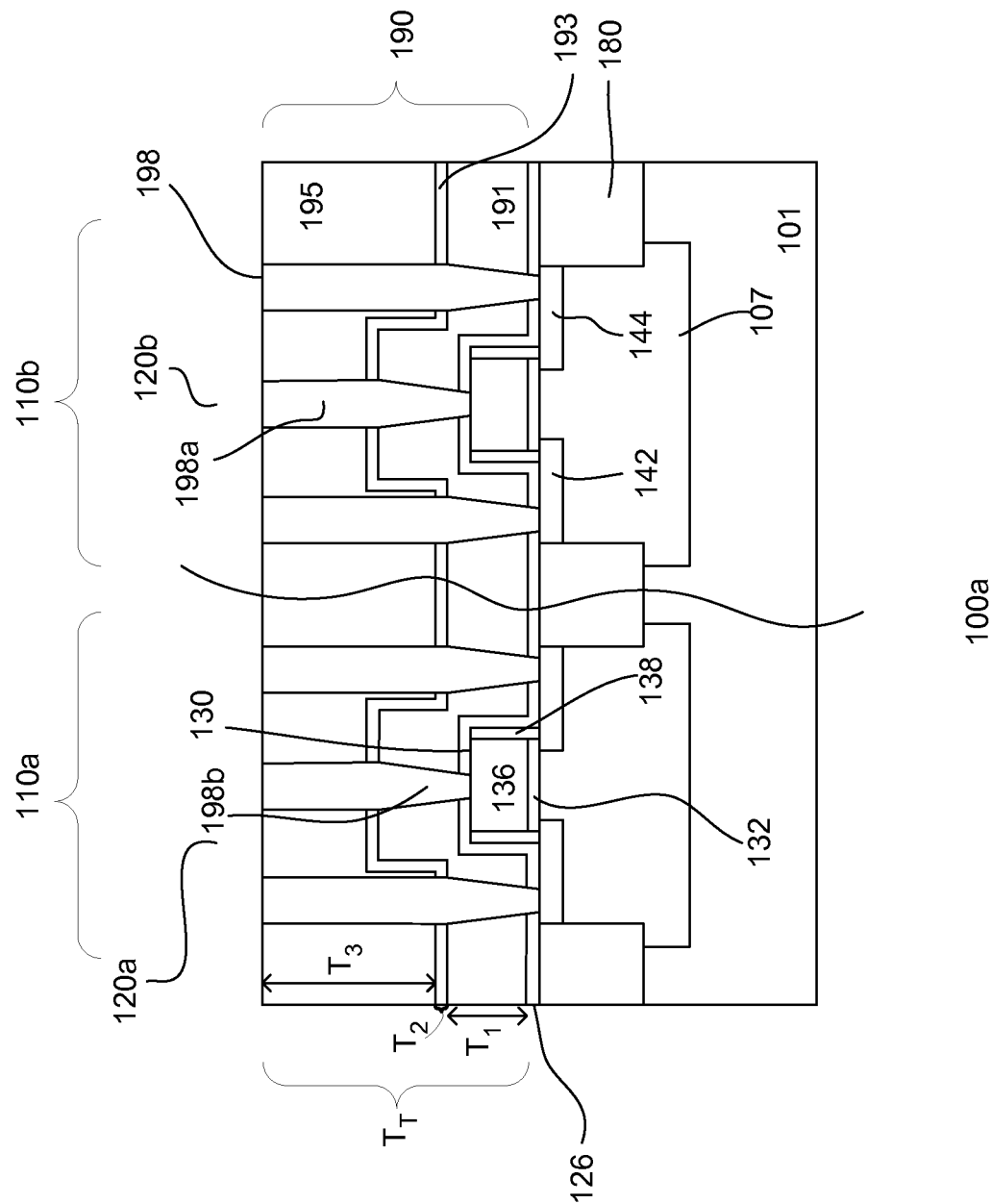
FIGS. 1a-1b show cross-sectional views of various embodiments of a portion of a device.

FIG. 1a shows a cross-sectional view of a portion of an embodiment of a device 100a. The device, for example, is an IC. Other types of devices may also be useful. As shown, the device includes a substrate 101. The substrate, for example, is a silicon substrate. Other types of substrates, such as silicon germanium, germanium, gallium arsenide, or crystal-on-insulator (COI) such as silicon-on-insulator (SOI), are also useful. The substrate may be a doped substrate. For example, the substrate can be lightly doped with p-type dopants. Providing a substrate with other types of dopants or dopant concentrations, as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be p or n. A lightly doped region may have a dopant concentration of about $1E11$-$1E13/cm^2$, and an intermediately doped region may have a dopant concentration of about $1E13$-$1E15/cm^2$, and a heavily doped region may have a dopant concentration of about $1E15$-$1E17/cm^2$. Providing other dopant concentrations for the different types of doped regions may also be useful. For example, the ranges may be varied, depending on the technology node. P-type dopants may include boron (B), aluminum (Al), indium (In) or a combination thereof, while n-type dopants may include phosphorous (P), arsenic (As), antimony (Sb) or a combination thereof.

The substrate includes first and second device regions 110a-b. Isolation regions may be provided for isolating or separating different regions of the substrate. In one embodiment, the device regions are isolated from other regions by isolation regions 180. For example, an isolation region surrounds a device region. The isolation regions, for example, are shallow trench isolation (STI) regions. Other types of isolation regions may also be employed. For example, the isolation regions may be deep trench isolation (DTI) regions. The STI regions, for example, extend to a depth of about 2000-5000 Å. Providing isolation regions which extend to other depths may also be useful.

First and second transistors 120a-b are provided in the first and second device regions. For example, the first transistor is disposed in the first device region and the second transistor is disposed in the second device region.

A transistor includes a gate 130 disposed on the substrate in a device region between first and second source/drain (S/D) regions 142 and 144 in the substrate. The S/D regions are heavily doped regions having a dopant concentration of, for example, about $1E15$-$1E17/cm^2$. The depth of the S/D regions may be about 0.1-0.4 μm. Lightly doped (LD) regions which extend from the S/D regions to under the gate may be provided. The LD regions are lightly doped regions having a dopant concentration of, for example, about $5E13$-$5E15/cm^2$ with a depth of about 0.05-0.3 μm. Providing S/D and LD regions with other dopant concentrations or depths may also be useful. Dielectric sidewall spacers 138 may be disposed on sidewalls of the gate. The spacers may be used to facilitate forming the S/D and LD regions. For example, LD regions are formed without spacers while S/D regions are formed with the spacers.

A device well 107 may be disposed in a device region. The device well, is disposed within the isolation region. The dopant concentration of the device wells may be light to intermediate. For example, the dopant concentration of the device wells may be about $5E12$-$5E13/cm^2$. Other dopant concentration for the device wells may also be useful. A depth of the device wells may be about 0.5-5 μm. Other depths for the device wells may also be useful. In one embodiment, the device well of a transistor is doped with dopants which are of the opposite polarity as the S/D and LD regions. For example, if the S/D and LD regions are doped with n-type dopants, then the device well is a p-type doped well. The device well serves as a body of the transistor.

As for the gate, it includes a gate electrode 136 over a gate dielectric 132. The gate electrode, for example, may be polysilicon. The gate electrode may be about 700-5000 Å thick. Other types of gate electrodes as well as thicknesses may also be useful. As for the gate dielectric, it may be formed of silicon oxide. The thickness of the gate dielectric may be, for example, about 10-40 Å. Other types of gate dielectrics or thicknesses may also be useful.

Metal silicide contacts (not shown) may be formed on the S/D regions and on the gate electrodes. The metal silicide contacts, for example, may be nickel-based contacts. Other types of metal silicide contacts may also be useful. For example, the metal silicide contact may be cobalt silicide (CoSi). The silicide contacts may be about 50-300 Å thick. Other thicknesses may also be useful. The metal silicide contacts may be employed to reduce contact resistance and facilitate contact to the back-end-of-line metal interconnects.

In one embodiment, the first and second transistors are of the opposite type. For example, the first transistor is a p-type transistor while the second transistor is a n-type transistor. The S/D and LD regions of a n-type transistor are doped with n-type dopants while a p-type transistor has p-type doped S/D and LD regions.

Although n-type and p-type transistors are shown, the device may include other types of device regions for other types of transistors or circuit components. For example, a device may include high voltage (HV) complementary transistors, low voltage (LV) complementary transistors, medium or intermediate voltage (MV) complementary transistors. Providing other types of circuit components may also be useful. For example, the device may include non-volatile memory (NMV) cells or other types of memory cells. As shown, the gates of the transistor have about the same height. Providing transistors or circuit components having different heights may also be useful.

In one embodiment, a dielectric etch stop layer 126 may be disposed over the substrate, lining the substrate and transistors. The etch stop layer, for example, is a silicon nitride etch stop layer. Other types of etch stop layers may also be useful. The etch stop layer should have a material which can be selectively removed from a dielectric layer thereover. The etch stop layer facilitates in forming contact plugs to contact regions of the transistor, such as the gate electrode and S/D regions. The etch stop layer may be about 400-450 Å. For example, the etch stop layer may be about 410-440 Å thick. In one embodiment, the etch stop layer is about 425 Å. Other thicknesses may also be useful. In other embodiments, the dielectric etch stop layer may not be formed over the substrate.

A contact dielectric layer 190 is disposed over the substrate covering the transistors. For example, the contact dielectric layer 190 covers the etch stop layer 126. The contact dielectric layer serves as a contact level. For example, the contact dielectric layer serves as the first contact or CA level. The contact dielectric layer should be sufficiently thick to accommodate contacts. The contact dielectric layer includes a total thickness $T_T$. The total thickness $T_T$ of the contact dielectric layer refers to a thickness value of the first contact level, which varies, depending on the technology node and design requirements.

In one embodiment, the dielectric layer is a contact dielectric stack, having a plurality of contact dielectric sub-layers. The various layers are conformal dielectric layers. In one embodiment, the contact dielectric stack includes lower and upper contact dielectric layers 191 and 195 sandwiching an intermediate dielectric etch stop layer 193. As shown, the lower contact dielectric layer tracks the topography of the substrate. For example, the lower contact dielectric layer tracks the profile of the underlying substrate, including the transistors. The lower contact dielectric layer, in one embodiment, is conformal with the horizontal portions of the substrate. As for sides of the gates, the lower contact dielectric layer is thinner than the portion which is above the top of the gates. The intermediate etch stop layer 193, as shown in FIG. 1a, is disposed on the lower contact dielectric layer 191. The intermediate etch stop layer lines the lower contact dielectric layer. As for the upper contact dielectric layer 195, it is disposed over the intermediate dielectric etch stop layer.

The contact dielectric stack for use in a contact level, preferably, includes dielectric materials having about the same desired dielectric constant (k) which is determined by a particular technology node. In one embodiment, the desired k value is about 4. Other suitable values for the dielectric constant may also be useful. In one embodiment, the lower contact dielectric layer 191 includes a first dielectric material. The first dielectric material, for example, includes a first oxide material. The upper contact dielectric layer 195, in one embodiment, includes a second dielectric material. The second dielectric material, for example, includes a second oxide material. The second oxide material, for example, may be different or the same as the first oxide material. Any other suitable type of dielectric materials may be selected for the first and second dielectric materials so long as they have about the same desired dielectric constant. As for the intermediate etch stop layer 193, in one embodiment, it is a single etch stop layer. In another embodiment, the intermediate etch stop layer is a bi-layer etch stop stack. The intermediate etch stop layer may include more than two layers. In one embodiment, the intermediate etch stop layer includes one or more dielectric materials. Various types of dielectric materials which can be etched selective to the layers above and below it may be used for the intermediate etch stop layer. Preferably, the one or more dielectric materials of the intermediate etch stop layer, whether alone or in combination, should have about the same desired dielectric constant with the lower and upper contact dielectric layers.

The lower contact dielectric layer 191 includes a thickness $T_1$, the intermediate etch stop layer 193 includes a thickness $T_2$ while the upper contact dielectric layer 195 includes a thickness $T_3$. The total thickness $T_T$ of the contact dielectric layer 190 is defined by the total thicknesses of $T_1$, $T_2$ and $T_3$. As described, the total thickness $T_T$ of the contact dielectric layer depends on the technology node and design requirements. For example, the total thickness $T_T$ of the contact dielectric layer which is employed in, for example, 40 nm technology node, is about 2000-3000 Å. The total thickness $T_T$ of the contact dielectric layer, for example, is about 2500 Å. Other suitable total thickness dimensions or ranges for the contact dielectric layer may also be useful.

The thickness $T_1$ of the lower contact dielectric layer 191 should be sufficient to facilitate gap fill. For example, the thickness $T_1$ of the lower contact dielectric layer may be equal to about the height of the transistor. Other thicknesses, such as not equal to the height of the transistor, may also be useful. For example, the thickness of the lower contact dielectric layer may not be less than the height of the transistor while facilitating gap fill. The thickness $T_1$ of the lower contact dielectric layer may be about 600-1000 Å. For example, the thickness $T_1$ of the lower contact dielectric layer 191 may be about 800 Å for a gate height of about 800 Å. Other suitable thicknesses may also be useful, determined by or depending on the gate height thickness and gap fill requirements.

As for the thickness $T_2$ of the intermediate etch stop layer, it varies as the thickness of the intermediate etch stop layer can be tuned or adjusted to achieve the desired dielectric constant such as it is about the same as the upper and lower contact dielectric layers. For illustration purpose, the intermediate etch stop layer, as shown in FIG. 1a, is a single etch stop layer. In another embodiment, the intermediate etch stop layer is a bi-layer etch stop layer. The intermediate etch stop layer may include more than two etch stop layers. In the case of a bi-layer etch stop layer (not shown), the first and second etch stop layers may have different dielectric constant values. For example, the first etch stop layer may have a first dielectric constant $k_1$ and the second dielectric constant may have a second dielectric constant $k_2$, which may be different than $k_1$. The first dielectric constant $k_1$, for example, may be about 3-4 while the second dielectric constant $k_2$, for example, may be about 4.5-5.5. In one embodiment, the thickness of the individual first and second etch stop layers may be adjusted to achieve the desired dielectric constant k, which is about the same dielectric constant of the lower and upper contact dielectric layers. The desired dielectric constant, in one embodiment, is about 4. The dielectric constants $k_1$, $k_2$ and k may include other suitable values. A thickness of the intermediate etch stop layer $T_2$, for example, may be about 100-400 Å. In one embodiment, the thickness $T_2$ is about 200 Å thick. Other suitable thicknesses may also be useful so long as it has about the same dielectric constant as the layers above and below it.

The thickness $T_3$ of the upper contact dielectric layer 195 varies as it depends on the thicknesses of $T_1$ and $T_2$ so that the thickness $T_3$, when combined with $T_1$ and $T_2$, does not exceed the total thickness $T_T$ which is a thickness value of the first contact level which is determined by or depends on the technology node and design requirements. The thickness $T_3$, for example, is about 1300-1600 Å. In one embodiment, the thickness $T_3$ is about 1500 Å. Other thicknesses may also be useful.

Contacts 198 are disposed in the contact dielectric layer 190. The contacts, as shown, are in communication with contact regions of the transistors. For example, contacts are provided in communication with S/D regions and gate electrodes. In one embodiment, the contacts have an upper portion 198a in the upper contact dielectric layer 195 and a lower portion 198b in the lower contact dielectric layer 191. In one embodiment, the profile of the upper portions of the contact is larger than the lower portions. The upper portions may have vertical sidewalls while the lower portions have tapered sidewalls. The tapered sidewalls, for example, may have sidewall angle of about 87°-88°. Other tapered sidewall angles may also be useful.

As described, the contacts 198 include upper and lower portions having different sidewall profiles. This advantageously enables contact openings for the contacts to be formed larger to prevent missing the contact regions. For example, the critical dimension (CD) of the contact openings may be formed about 3~4 nm larger on lithographic process to prevent random contact missing on the lithographic process. Furthermore, providing a tapered profile at the lower portions prevents shorting of the S/D contacts with the gates. The use of the intermediate etch stop layer in the contact level, for example, allows for such contacts 198 having different sidewall profiles to be formed. It is understood that other suitable techniques may be used to form the contacts having different sidewall profiles. In addition, when the intermediate etch stop layer has about the same dielectric constant as the upper and lower contact dielectric layers, RC delay is minimized or prevented during the operation of the IC.

Figure 1B:
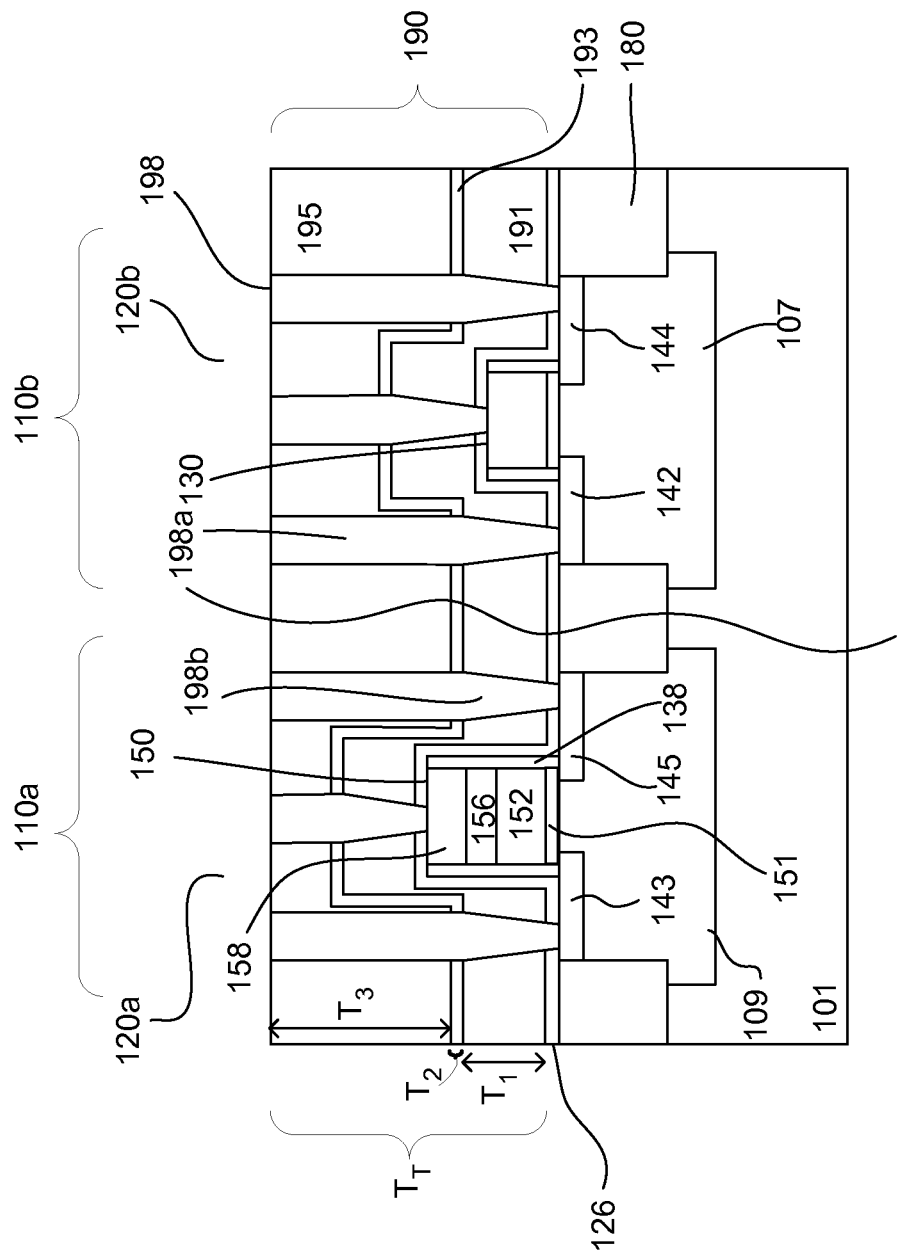

FIG. 1b shows another embodiment of a device 100b. The device is similar to that described in FIG. 1a. Common elements may not be described or described in detail. As shown, the device includes a substrate 101 which includes first and second device regions 110a-b. Isolation regions 180 may be provided for isolating or separating different regions of the substrate.

In one embodiment, the first device region is for a memory transistor 120a, such as a non-volatile memory (NVM) transistor. For example, the transistor includes a memory gate 150 between first and second memory S/D regions 143 and 145. The memory gate includes, for example, a gate dielectric 151, a first gate electrode 152 such as a floating gate, a charge storage layer such as an ONO stack 156 and a second gate electrode 158 such as a control gate. The memory transistor may include other types of memory transistors. A memory device well 109 is provided in the first device region. The memory well region is doped with opposite polarity dopants than the memory S/D regions. As for the second device region, it includes a transistor 120*b*. The transistor 120*b*, for example, is similar to that described in FIG. 1*a*. A dielectric etch stop layer 126 may be disposed over the substrate, lining the substrate and transistors.

Illustratively, the heights of the gates in the first and second device regions are different. For example, the memory gate has a height greater than a height of the gate in the second device region. Other configurations of gates may also be useful. Although a NVM cell and a transistor are shown, it is understood that the device may include other types of device regions for other types of transistors or circuit components.

A contact dielectric layer 190 is disposed over the substrate covering the transistors. For example, the contact dielectric layer covers the etch stop layer. The contact dielectric layer serves as a contact level. For example, the contact dielectric layer serves as the first contact or CA level. In one embodiment, the contact dielectric layer is a contact dielectric stack, having a plurality of contact dielectric sub-layers. In one embodiment, the contact stack includes lower and upper contact dielectric layers 191 and 195 sandwiching an intermediate dielectric etch stop layer 193. The intermediate dielectric etch stop layer may have one or more etch stop layers. The contact dielectric layer is similar to that already described in FIG. 1*a*.

Contacts 198 are disposed in the contact dielectric layer. The contacts, as shown, are in communication with contact regions of the transistors. For example, contacts are provided in communication with S/D regions and gates. In one embodiment, the contacts have an upper portion 198*a* in the upper contact dielectric layer and a lower portion 198*b* in the lower contact dielectric layer. In one embodiment, the profile of the upper portions of the contact is larger than the lower portions. The upper portions may have vertical sidewalls while the lower portions have tapered sidewalls. Even though the gates have different height, the thickness $T_1$ of the lower contact dielectric layer over the different gates depends on the height of the underlying transistor.

FIGS. 2*a*-2*i* show cross-sectional views of a process 200 for forming a device. The device, for example, is similar to that described in FIGS. 1*a*-1*b*. Common elements may not be described or described in detail.

Referring to FIG. 2*a*, a substrate 101 is shown. The substrate, for example, is a silicon substrate. Other types of substrates, such as silicon germanium, germanium, gallium arsenide, or crystal-on-insulator (COI) such as silicon-on-insulator (SOI), are also useful.

The substrate includes first and second device regions 110*a*-*b*. Isolation regions 180 are provided for isolating or separating different regions of the substrate. The isolation regions, for example, are shallow trench isolation (STI) regions. Other types of isolation regions may also be employed. The device regions are prepared with first and second device wells 107. The first device region is prepared with a first device well and the second device region is prepared with a second device well. The device wells are doped with opposite polarity type dopants. For example, the first device well is doped with second polarity type dopants while the second device wells are doped with first polarity type dopants.

The substrate is also prepared with first and second gates 130 of first and second transistors 120*a*-*b*. The gates, for example, are disposed on the device region. Each of the gates, for example, includes a gate electrode 136 disposed over a gate dielectric 132. First and second LD regions are disposed in the substrate in the device region adjacent to gates of the transistors. The LD regions of a transistor are doped with the opposite dopants as the device well. For example, if the device well is p-doped, then the LD regions of the transistor are lightly n-doped (n⁻). Dielectric sidewall spacers 138 may be disposed on sidewalls of the gate. The spacers, for example, are formed on the gate sidewalls after forming the LD regions. As shown, first and second S/D regions 142 and 144, which are heavily doped regions, are formed adjacent to the gates after forming the sidewall spacers.

In one embodiment, the first and second transistors 120*a*-*b* are of the opposite type. For example, the first transistor is a p-type transistor while the second transistor is a n-type transistor. The LD regions of a n-type transistor are doped with n-type dopants while a p-type transistor has p-type doped LD regions.

Although device regions for n-type and p-type transistors are shown, the device may include other types of device regions for other types of transistors ore circuit components. For example, a device may include high voltage (HV) complementary transistors, low voltage (LV) complementary transistors, medium or intermediate voltage (MV) complementary transistors. Providing other types of circuit components may also be useful. For example, the device may include non-volatile memory (NMV) cells or other types of memory cells. As shown, the gates of the transistor have about the same height. Providing transistors or circuit components having different heights may also be useful.

Figure 2B:
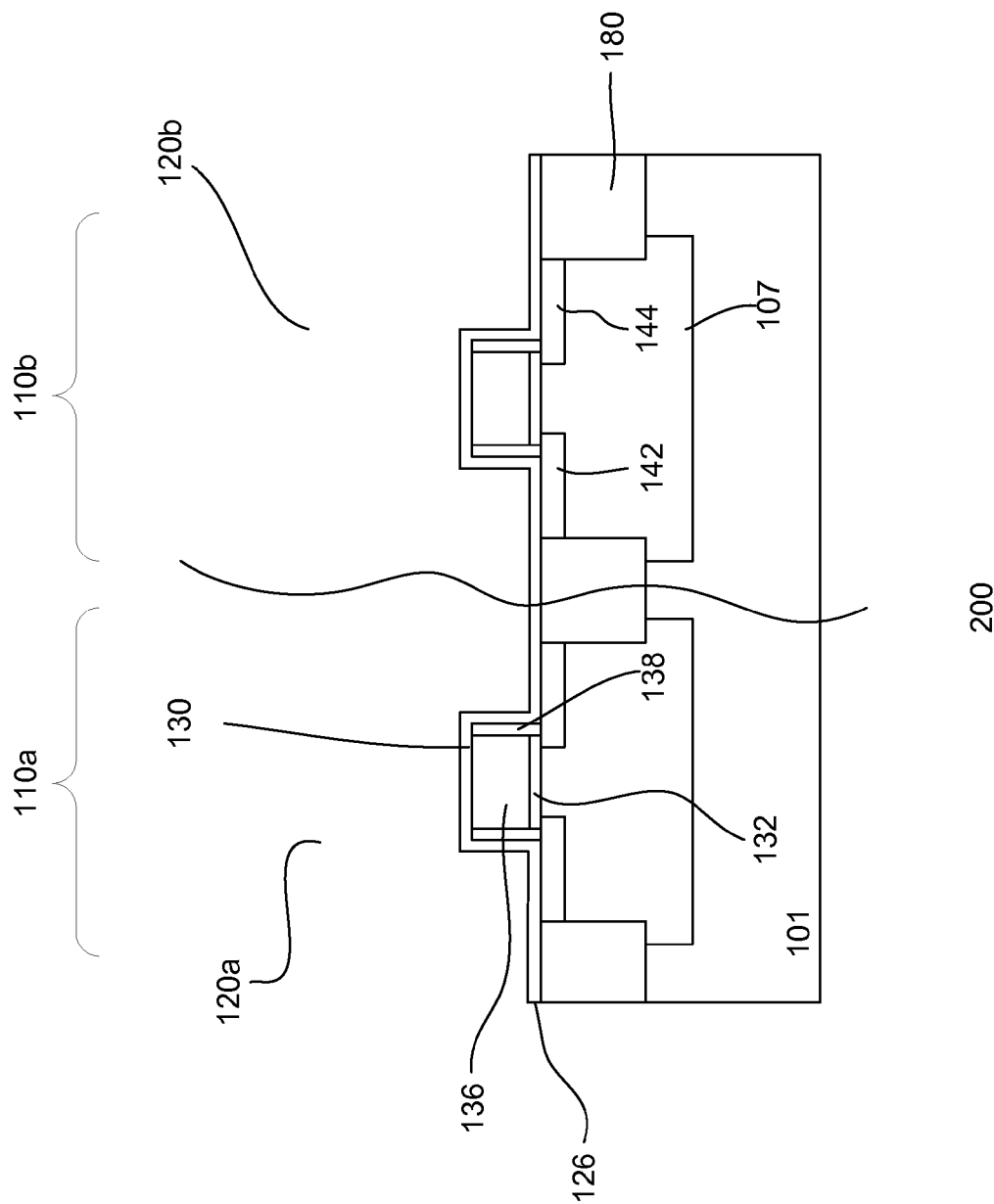

In FIG. 2*b*, a dielectric etch stop layer 126 is formed on the substrate, lining the substrate and gates. The etch stop layer, for example, is a silicon nitride etch stop layer. Other types of etch stop layers may also be useful. For example, any type of dielectric layer which can be removed selectively to layers above and below it may also be useful. The etch stop layer may be formed by, for example, chemical vapor deposition (CVD). Other techniques for forming the etch stop layer may also be useful. The etch stop layer may be about 300-450 Å. For example, the etch stop layer may be about 400-450 Å thick. In one embodiment, the etch stop layer is about 425 Å thick. Other thicknesses may also be useful. The etch stop layer, for example, may also serve as a stress layer.

Figure 2C:
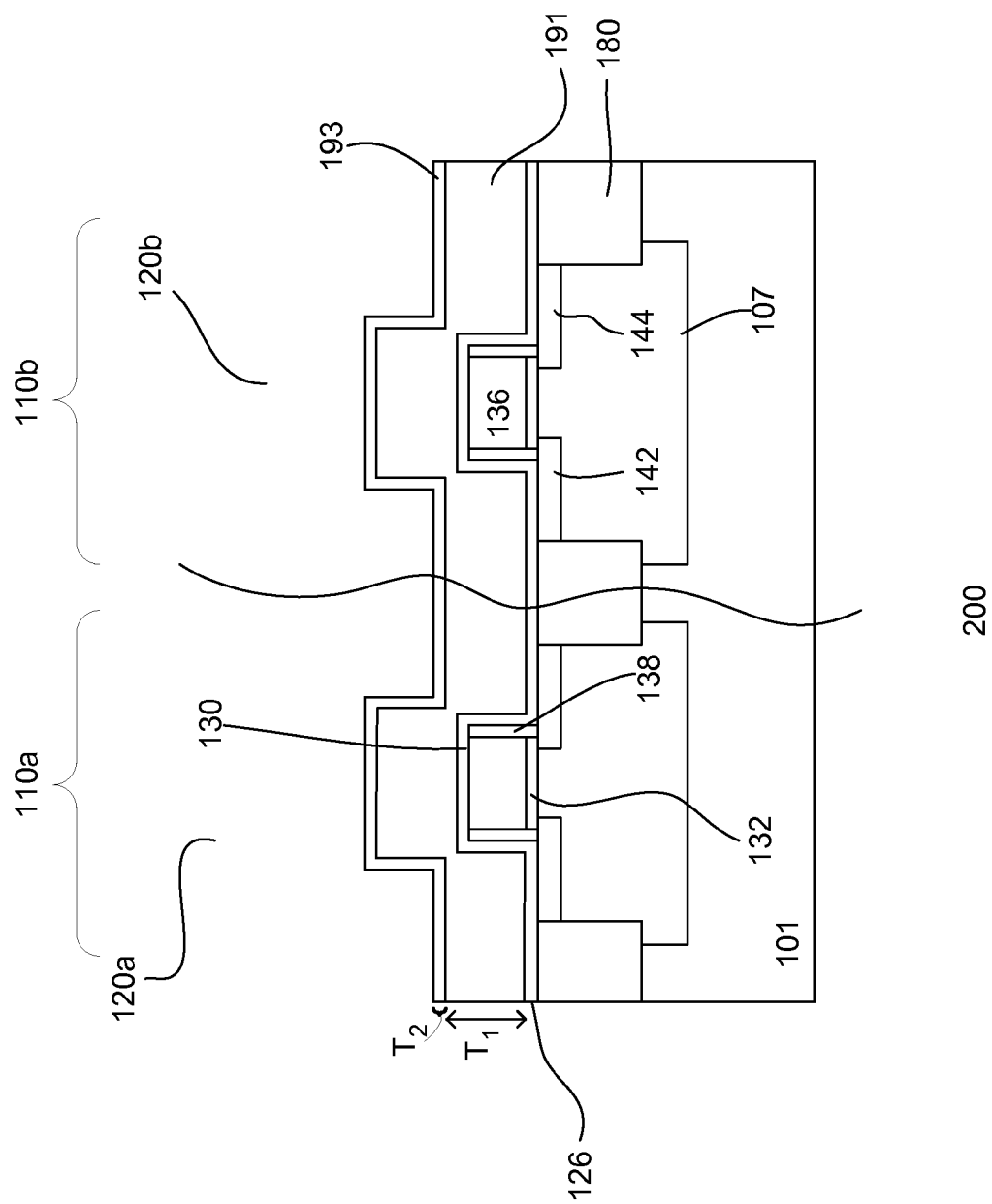

Referring to FIG. 2*c*, a lower contact dielectric layer 191 is deposited on the substrate. For example, the lower contact layer is formed on the etch stop layer 126. The lower contact dielectric layer, in one embodiment, includes a first dielectric material. The first dielectric material, for example, includes a first oxide material. Other suitable types of dielectric materials may also be useful.

The lower contact dielectric layer is formed over the substrate by, for example, chemical vapor deposition (CVD) process, preferably with high gap fill capabilities. Other suitable types of techniques for forming the lower contact dielectric layer may also be useful. As shown, the lower contact dielectric layer tracks the topography of the substrate. For example, the lower contact dielectric layer tracks the profile of the underlying substrate, including the gates. The lower contact dielectric layer, in one embodiment, is conformal with the horizontal portions of the substrate. As for sides of the gates, the lower contact dielectric layer is thinner than the portion which is above the top of the gates.

A thickness $T_1$ of the lower contact dielectric layer 191 should be sufficient to facilitate gap fill. For example, the thickness $T_1$ of the lower contact dielectric layer may be equal to about the height of the transistor. Other thicknesses, such as not equal to the height of the transistor, may also be useful. For example, the thickness of the lower contact dielectric layer may not be less than the height of the transistor while facilitating gap fill. The thickness $T_1$ of the lower layer may be about 600-1000 Å. For example, the thickness $T_1$ of the lower contact dielectric layer 191 may be about 800 Å for a gate height of about 800 Å. Other thicknesses may also be useful.

An intermediate etch stop layer 193 is formed on the lower contact dielectric layer 191. The intermediate etch stop layer lines the surface of the lower contact dielectric layer. The etch stop layer may be formed by, for example, CVD. Other techniques for forming the etch stop layer may also be useful. The intermediate etch stop layer may include one or more etch stop layers. In one embodiment, the intermediate etch stop layer is a single etch stop layer. In another embodiment, the intermediate etch stop layer is a bi-layer etch stop stack (not shown). Various types of dielectric materials which can be etched selective to the layers above and below it may be used for the intermediate etch stop layer. Preferably, the one or more dielectric materials of the intermediate etch stop layer, whether alone or in combination, should have about the same dielectric constant with the lower and upper contact dielectric layers. A thickness $T_2$ of the intermediate etch stop layer may be about 100-400 Å. In one embodiment, the thickness $T_2$ is about 200 Å. The thickness $T_2$ can be adjusted or varied to achieve the desired dielectric constant.

Figure 2D:
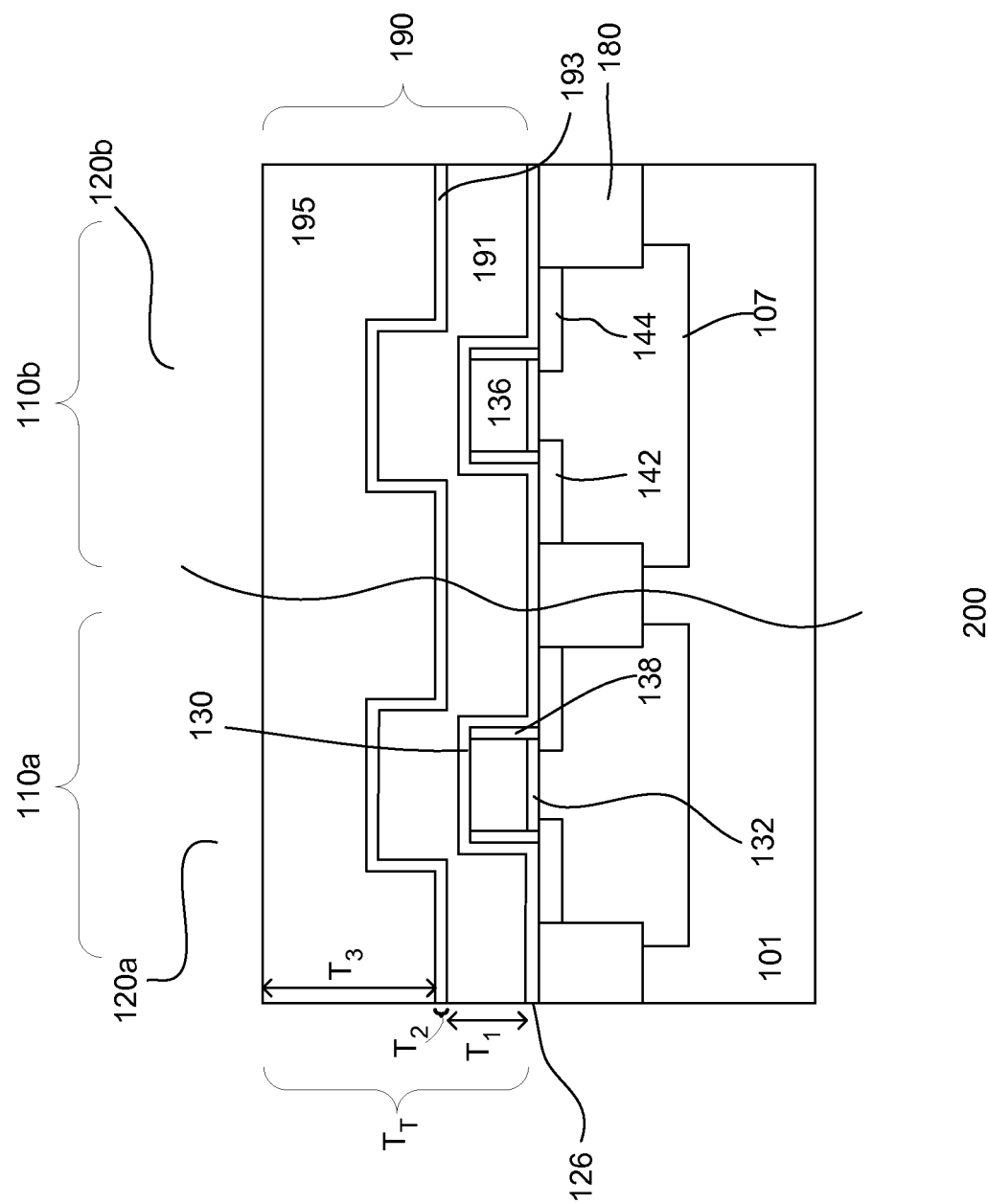

As shown in FIG. 2d, an upper contact dielectric layer 195 is formed on the substrate, covering the intermediate etch stop layer 193. Various types of dielectric materials may be used to form the upper dielectric layer. In one embodiment the upper dielectric layer includes a second dielectric material. The second dielectric material may be the same or different than the first dielectric material. For example, the second dielectric material includes a second oxide material. Other types of dielectric materials may also be useful. The upper contact dielectric layer may be formed by CVD. Forming the dielectric layer using other techniques may also be useful.

The surface of the upper contact dielectric layer 195 is planarized to form a planar top surface. For example, the upper contact dielectric layer is planarized by a chemical mechanical polish (CMP) process. Other techniques for planarizing the upper dielectric layer may also be useful. The thickness $T_3$ of the upper contact dielectric layer varies as it depends on the thicknesses of $T_1$ and $T_2$ so that the thickness $T_3$, when combined with $T_1$ and $T_2$, does not exceed the total thickness $T_T$ of the contact dielectric layer 190 which is determined or depends on the technology node and design requirements. The thickness $T_3$, for example, is about 1300-1600 Å. In one embodiment, the thickness $T_3$ is about 1500 Å. Providing an upper contact dielectric layer having other thicknesses may also be useful.

Figure 2E:
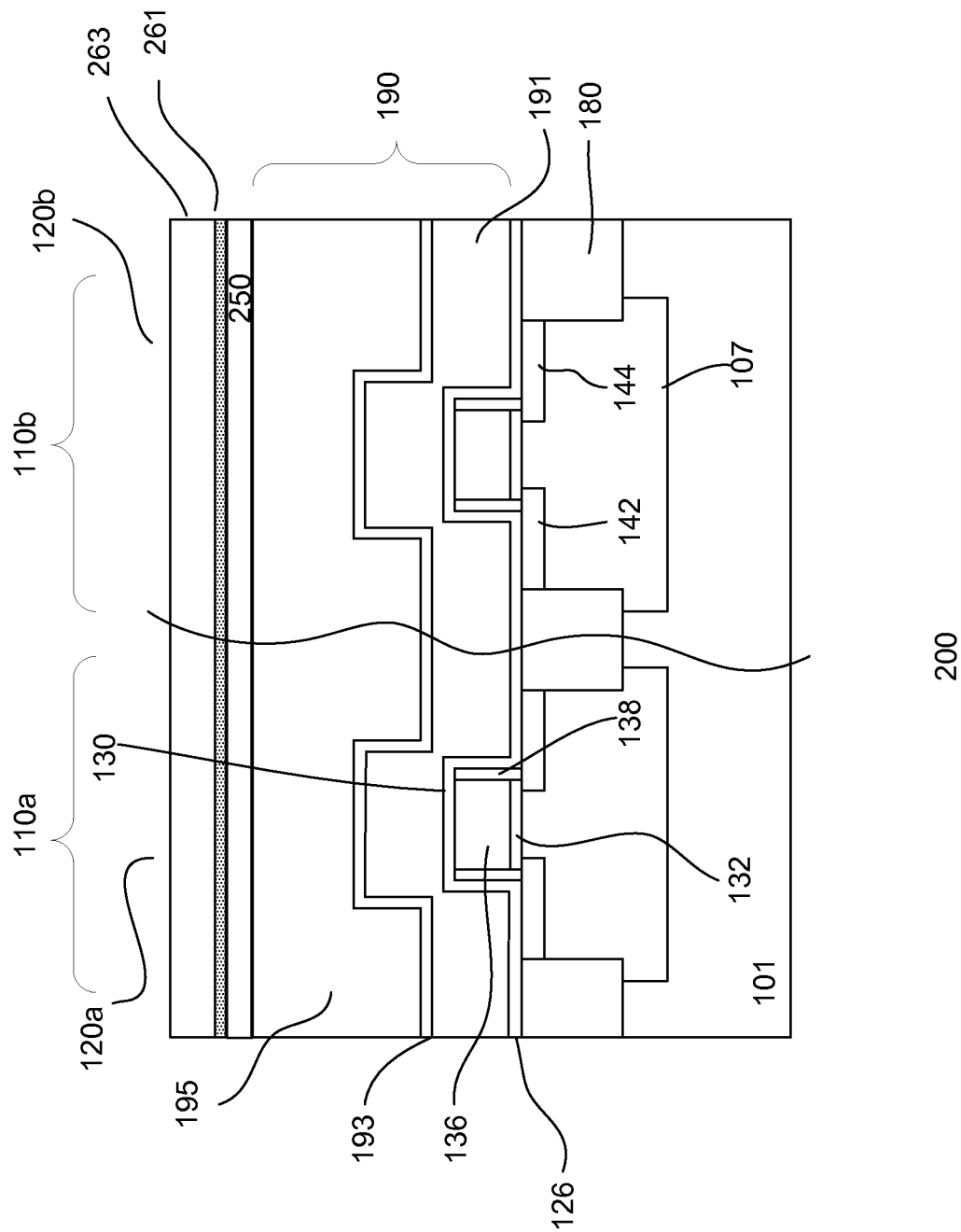

The process continues by forming contacts. Referring to FIG. 2e, a hard mask layer 250 is formed over the upper contact dielectric layer 195. The hard mask layer, for example, includes a dielectric material. The hard mask layer, for example, is about 2000 Å thick. The hard mask layer may be formed by, for example, CVD. Other configurations of the hard mask layer, including thicknesses and types, may also be useful.

Referring to FIG. 2e, an antireflective coating (ARC) layer 261 may optionally be formed on the hard mask layer 250. The ARC layer, for example, is used to improve lithographic resolution. The thickness of the ARC layer, for example, may be about 600-1000 Å. Other thicknesses may also be useful. In one embodiment, the ARC layer is an ARC stack, having multiple layers. In one embodiment, the ARC stack includes first and second dielectric ARC layers capped by a cap layer (not shown). For example, the first ARC layer, second ARC layer and the cap layer are sequentially formed on the upper dielectric layer. In one embodiment, the first ARC layer is a high k ARC layer, the second ARC layer is a low k ARC layer and the cap layer is a silicon oxide cap layer. The first ARC layer may be about 400 Å thick, the second ARC layer may be about 350 Å thick and the cap layer is about 50 Å thick. Other configurations of the ARC stack may also be useful. The layers of the ARC stack may be formed by, for example, CVD. Other techniques for forming the ARC layers may also be useful. A soft mask layer 263 is formed over the ARC layer. The soft mask, for example, is a photoresist.

Figure 2F:
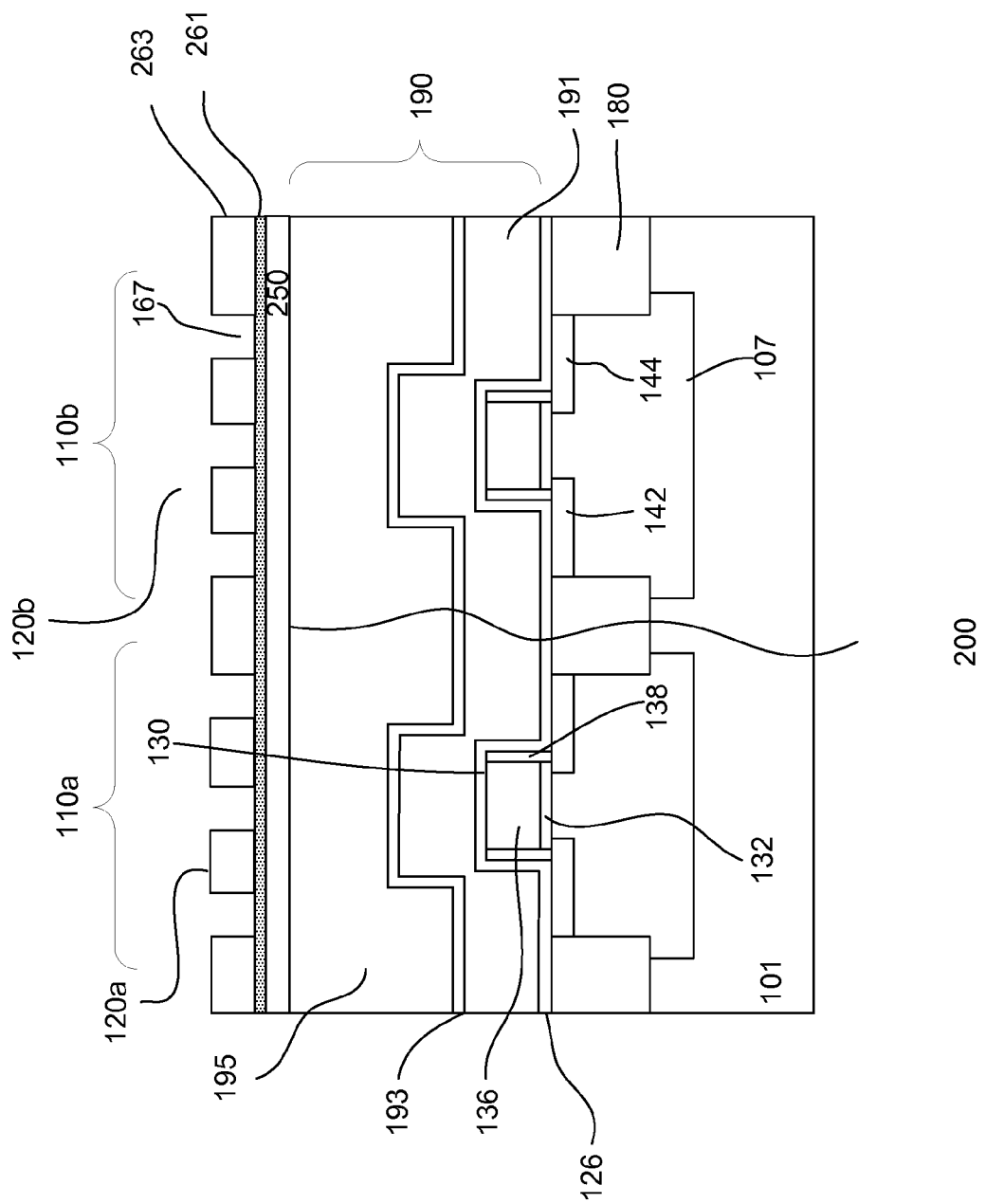

In FIG. 2f, the soft mask is patterned to form openings 167 corresponding to the contact regions. The openings, for example, are contact or via openings which correspond to contact regions of the transistor. Patterning the soft mask layer may be achieved by exposing it with an exposure source through a reticle. The soft mask is developed, transferring the pattern of the reticle to the soft mask layer. The openings may be larger than normal. For example, the openings may be increased by, for example, about 3~4 nm. This reduces the risk of missing the contact regions.

Figure 2G:
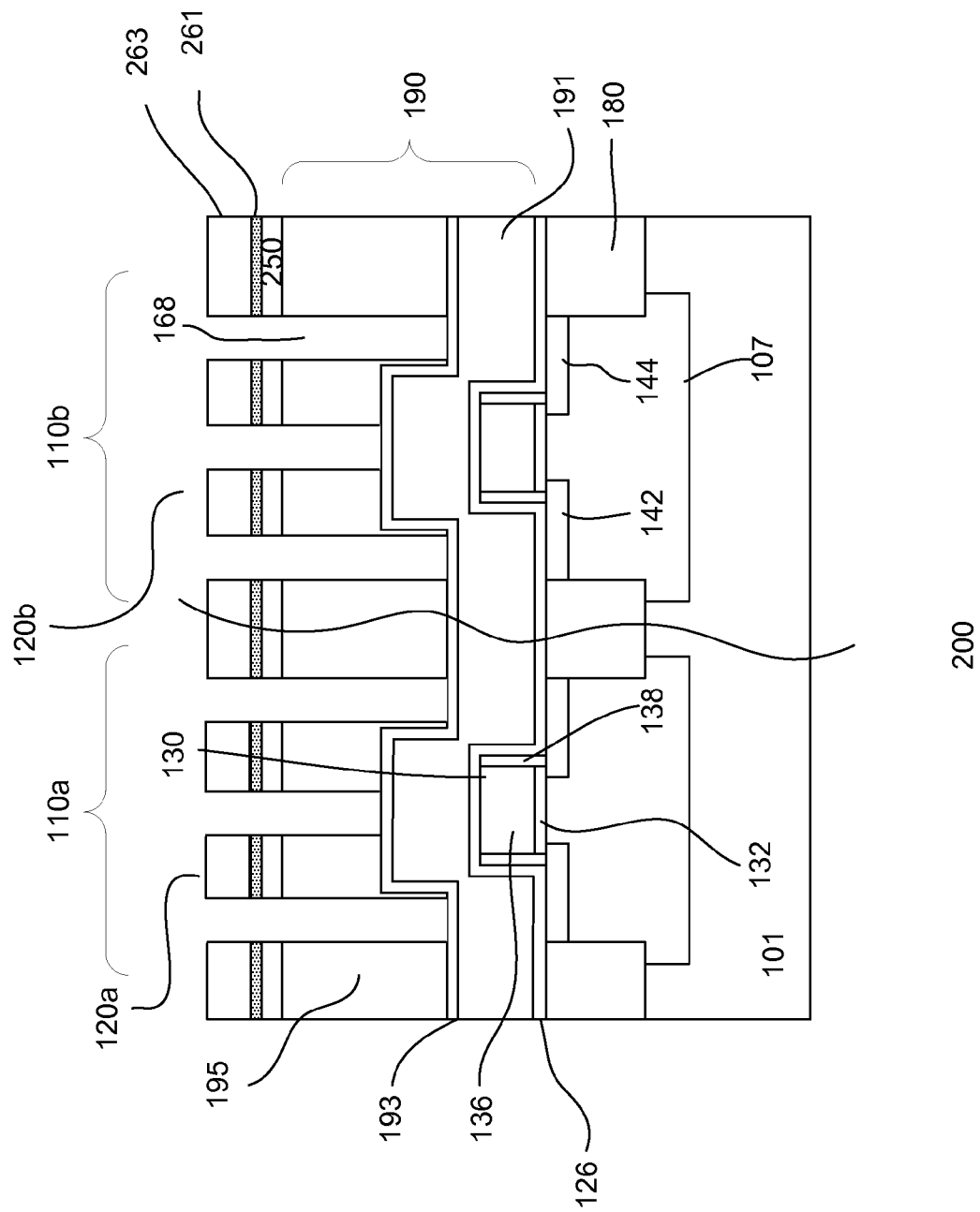

Referring to FIG. 2g, the ARC and the hard mask layers are opened. For example, an anisotropic etch, such as a reactive ion etch (RIE) removes exposed portions of the ARC and hard mask layers unprotected by the soft mask layer. After the hard mask layer is opened, the upper contact dielectric layer is etched to form upper contact openings 168. The upper contact dielectric layer is etched selective to the intermediate etch stop layer 193. For example, the etch stops at the intermediate etch stop layer. The etch, for example, forms upper contact openings with about vertical sidewalls. For example, the etch parameters are selected to form vertical or substantially vertical sidewalls. The etch, for example, includes $CF_4/H_2$ etch chemistries. Any suitable etch chemistries may be used depending on the material of the upper contact dielectric layer.

Figure 2H:
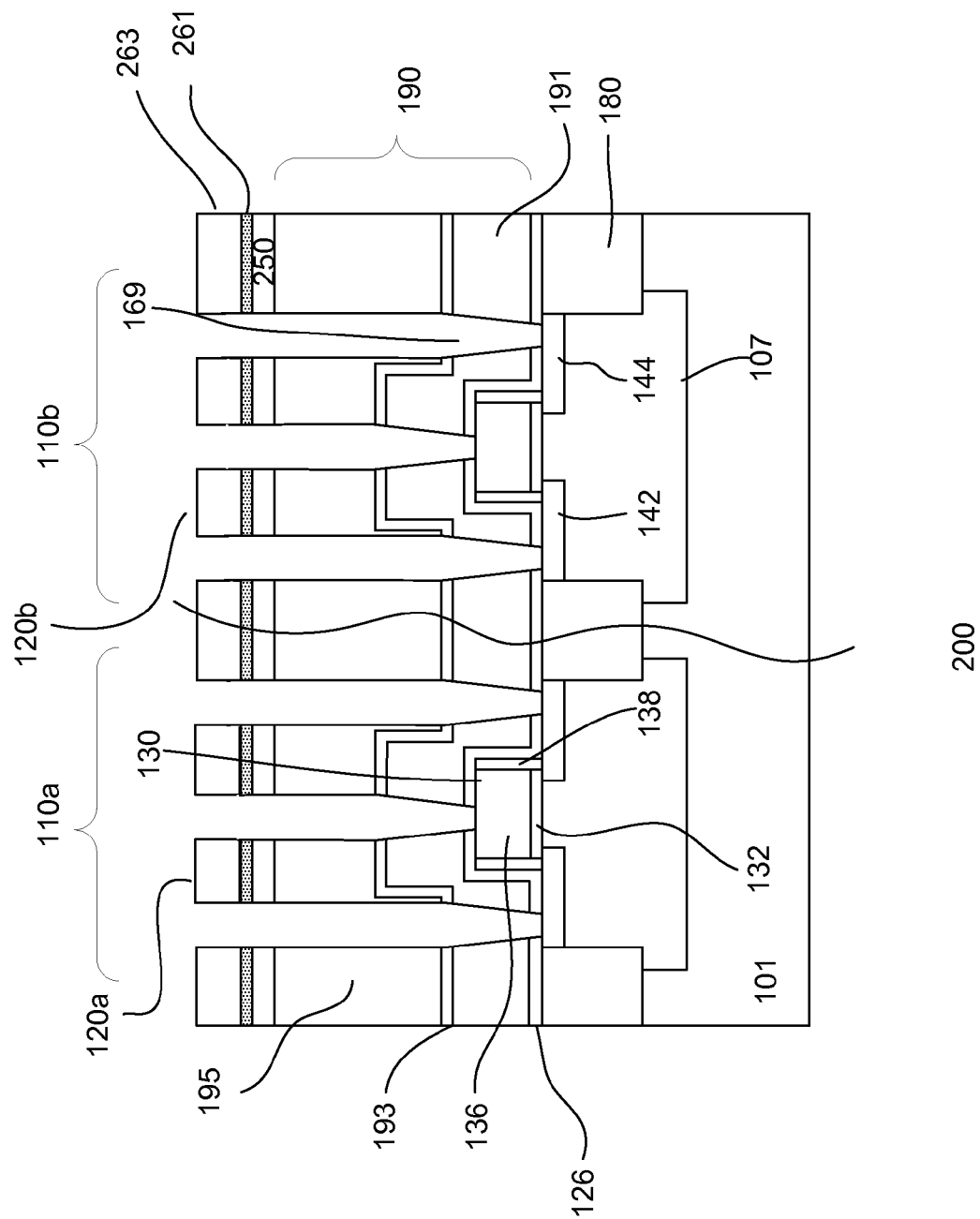

After forming the upper contact openings in the upper contact dielectric layer, the intermediate etch stop layer 193 is etched, exposing the lower contact dielectric layer 191, as shown in FIG. 2h. The etch to remove the intermediate etch stop layer, for example, includes $CF_4/CH_2F_2/O_2$ etch chemistries. Other suitable etch chemistries may be employed, depending on the materials of the intermediate etch stop layer. The lower contact dielectric layer 191 is etched to form lower contact openings 169. In one embodiment, the lower contact openings include a tapered sidewall profile. The tapered sidewalls, for example, may have sidewall angle of about 87°-88°. Other tapered sidewall angles may also be useful. The tapered profile may be achieved by, for example, changing the etch gas. For example, the tapered profile may be achieved by changing the etch gas to a polymer rich etch gas. The polymer rich etch gas, for example, includes $C_4F_8/C_4F_6/O_2$ etch chemistries. Other techniques for forming the lower contact openings with a tapered sidewall profile may also be useful. The etch for the different layers of the contact dielectric layers may be performed in-situ. After forming the contact openings, the hard mask, ARC and soft mask layers are removed by suitable techniques.

As described, the upper and lower contact openings have different sidewall profiles. For example, the upper contact openings 168 have a vertical sidewall profile while the lower contact openings 169 have a tapered sidewall profile.

Figure 2I:
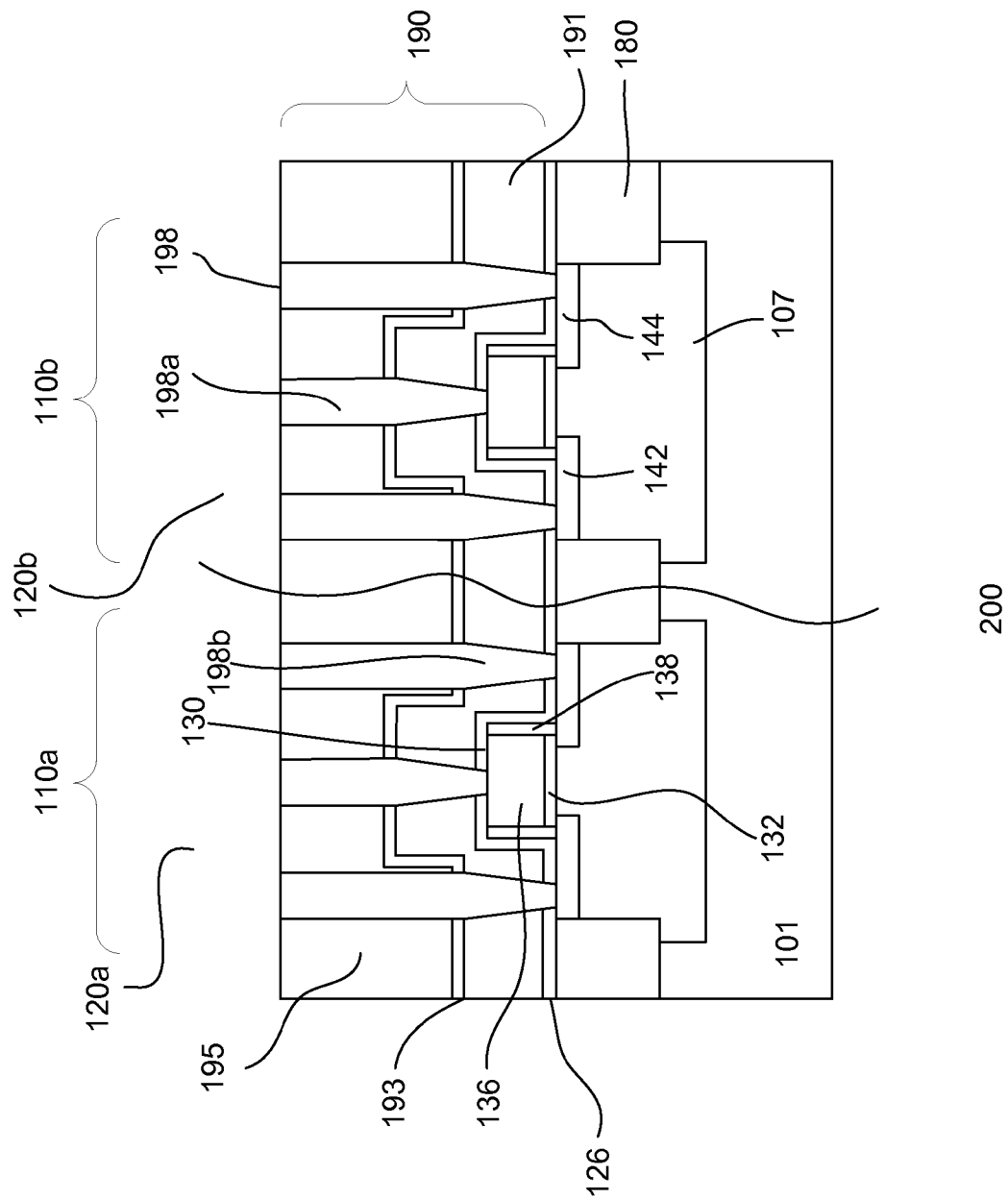

Referring to FIG. 2i, contacts 198 are formed in the contact openings. The contacts are formed by, for example, forming a conductive layer in the substrate, filling the contact openings and covering the contact dielectric layer. Liners may be formed lining the contact openings prior to filling them with conductive material. Other types of liners may also be useful. The conductive layer, for example, is tungsten. Other types of conductive materials may also be useful to fill the contact openings. Excess conductive material may be removed by, for example, CMP. In one embodiment, the CMP removes excess conductive material. This forms a planar top surface between the contacts and upper contact dielectric layer.

The process continues to form the device. The processing may include forming metal layers for interconnect levels, final passivation, dicing, assembly and packaging. Other processes may also be included. For example, other components, such as low voltage, medium voltage, and high voltage I/O devices can be formed prior to forming the interconnections.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a substrate having a device component with a contact region;
forming a contact dielectric layer on the substrate, covering the substrate and the device component, wherein forming the contact dielectric layer comprises
forming a lower contact dielectric layer,
forming an intermediate contact dielectric etch stop layer on the lower contact dielectric layer,
forming an upper contact dielectric layer on the contact dielectric etch stop layer; and
forming a contact opening through the contact dielectric layer, wherein the contact opening has an upper contact sidewall profile in the upper contact dielectric layer and a lower tapered contact sidewall profile in the lower contact dielectric layer, wherein forming the contact opening comprises
forming a hard mask over the upper contact dielectric layer,
patterning the hard mask to form a hard mask opening corresponding to location where the contact opening is to be formed,
performing a first etch to remove exposed portion of the upper contact dielectric layer to form an upper portion of the contact opening having the upper contact sidewall profile,
performing a second etch to remove exposed portion of the intermediate contact dielectric etch stop layer, and
performing a third etch to remove exposed portion of the lower contact dielectric layer to form a lower portion of the contact opening having the lower tapered contact sidewall profile, wherein the lower tapered contact sidewall profile prevents shorting with the device component.

2. The method of claim 1 wherein the lower contact dielectric layer comprises a first dielectric material and the upper contact dielectric layer comprises a second dielectric material, wherein the first and second dielectric materials are different.

3. The method of claim 2 wherein the intermediate contact dielectric etch stop layer comprises a material which can be etched selective to the upper and lower contact dielectric layers.

4. The method of claim 2 wherein the upper and lower contact dielectric layers and the intermediate contact dielectric etch stop layer comprise about the same dielectric constant.

5. The method of claim 4 wherein the intermediate contact dielectric etch stop layer comprises one or more etch stop layers.

6. The method of claim 1 wherein the third etch comprises a polymer rich etch gas.

7. A method of forming a device comprising:
providing a substrate having at least one device component with a contact region;
forming a contact dielectric layer on the substrate, covering the substrate and the device component, wherein the contact dielectric layer comprises an upper portion and a lower portion;
forming an intermediate contact dielectric etch stop layer in between the upper and lower portions of the contact dielectric layer; and
forming a contact opening which passes through the upper and lower portions of the contact dielectric layer and the intermediate contact dielectric etch stop layer, wherein the same contact opening has an upper contact sidewall profile with a straight profile in the upper portion of the contact dielectric layer and a lower tapered contact sidewall profile in the lower portion of the contact dielectric layer which extends at least from bottom of the intermediate contact dielectric etch stop layer, wherein the lower tapered contact sidewall profile prevents shorting with the device component.

8. The method of claim 7 wherein forming the contact dielectric layer comprises:
forming a lower contact dielectric layer having a thickness $T_1$, wherein the lower contact dielectric layer corresponds to the lower portion of the contact dielectric layer;
forming the intermediate contact dielectric etch stop layer having a thickness $T_2$ on the lower contact dielectric layer; and
forming an upper contact dielectric layer having a thickness $T_3$ on the intermediate contact dielectric etch stop layer, wherein the upper contact dielectric layer corresponds to the upper portion of the contact dielectric layer.

9. The method of claim 8 wherein the lower contact dielectric layer comprises a first dielectric material and the upper contact dielectric layer comprises a second dielectric material, wherein the first and second dielectric materials are different.

10. The method of claim 8 wherein:
the contact dielectric layer comprises a total thickness $T_T$ defined by the total thicknesses of $T_1$, $T_2$ and $T_3$ and wherein the thickness $T_T$ comprises a thickness value of a first contact level depending on a technology node.

11. The method of claim 8 wherein:
the upper and lower contact dielectric layers comprise about the same dielectric constant; and comprising
adjusting the thickness $T_2$ of the intermediate contact dielectric etch stop layer to achieve about the same dielectric constant as the upper and lower contact dielectric layers.

12. The method of claim 8 wherein forming the contact opening comprises:
forming a hard mask over the upper contact dielectric layer;
patterning the hard mask to form a hard mask opening corresponding to location where the contact opening is to be formed;
performing a first etch to remove exposed portion of the upper contact dielectric layer to form an upper portion of the contact opening having the upper contact sidewall profile with the straight profile;

performing a second etch to remove exposed portion of the intermediate contact dielectric etch stop layer; and performing a third etch to remove exposed portion of the lower contact dielectric layer to form a lower portion of the contact opening having the lower tapered contact sidewall profile.

13. The method of claim 7 wherein forming the contact opening comprises:

performing a first etch to remove exposed upper portion of the contact dielectric layer to form an upper portion of the contact opening having the upper contact sidewall profile with the straight profile;

performing a second etch to remove exposed portion of the intermediate contact dielectric etch stop layer; and performing a third etch to remove exposed lower portion of the contact dielectric layer to form a lower portion of the contact opening having the lower tapered contact sidewall profile.

14. The method of claim 7 wherein the at least one device component comprises first and second device components, wherein the first and second device components comprise different heights.

15. The method of claim 7 wherein forming the contact dielectric layer comprises:

forming a lower contact dielectric layer over the substrate, wherein the lower contact dielectric layer corresponds to the lower portion of the contact dielectric layer;

forming the intermediate contact dielectric etch stop layer on the lower contact dielectric layer; and forming an upper contact dielectric layer on the intermediate contact dielectric etch stop layer, wherein
the upper contact dielectric layer corresponds to the upper portion of the contact dielectric layer, and
the intermediate contact dielectric etch stop layer comprises at least first and second stop layers, wherein the first etch stop layer comprises a first dielectric constant $k_1$ and the second etch stop layer comprises a second dielectric constant $k_2$, and thickness of the individual first and second etch stop layers are adjusted to achieve a desired dielectric constant which is about the same dielectric constant of the upper and lower contact dielectric layers.

16. A device comprising:

a substrate having at least one device component with a contact region;

a contact dielectric layer covering the substrate and the device component, wherein the contact dielectric layer comprises an upper portion and a lower portion;

an intermediate contact dielectric etch stop layer disposed in between the upper and lower portions of the contact dielectric layer; and a contact opening which passes through the upper and lower portions of the contact dielectric layer and the intermediate contact dielectric etch stop layer, wherein the same contact opening has an upper contact sidewall profile with a straight profile in the upper portion of the contact dielectric layer and a lower tapered contact sidewall profile in the lower portion of the contact dielectric layer which extends at least from bottom of the intermediate contact dielectric etch stop layer, wherein the lower tapered contact sidewall profile prevents shorting with the device component.

17. The device of claim 16 wherein the contact dielectric layer comprises:

a lower contact dielectric layer having a thickness $T_1$, wherein the lower contact dielectric layer corresponds to the lower portion of the contact dielectric layer;

the intermediate contact dielectric etch stop layer having a thickness $T_2$ on the lower contact dielectric layer; and an upper contact dielectric layer having a thickness $T_3$ on the intermediate contact dielectric etch stop layer, wherein the upper contact dielectric layer corresponds to the upper portion of the contact dielectric layer.

18. The device of claim 17 wherein:

the lower contact dielectric layer comprises a first dielectric material;

the second contact dielectric layer comprises a second dielectric material, wherein the first and second dielectric materials are different; and the intermediate contact dielectric etch stop layer comprises a third dielectric material which can be etched selective to the first and second dielectric materials.

19. The device of claim 18 wherein the lower and upper dielectric layers and the intermediate contact dielectric etch stop layer comprise dielectric materials having about the same dielectric constant.

20. The device of claim 17 wherein the intermediate contact dielectric etch stop layer comprises a bi-layer etch stop layer having a thickness adjustable to achieve a desired dielectric constant such that it is about the same as dielectric constant of the upper and lower contact dielectric layers.

21. The device of claim 17 wherein:

the device component comprises a transistor having a gate which is disposed on the substrate; and the lower contact dielectric layer is conformal with horizontal portions of the substrate, wherein portions of the lower contact dielectric layer at sides of the gate are thinner compared to portion of the lower contact dielectric layer which is above a top surface of the gate.

* * * * *